United States Patent
Takeuchi et al.

(10) Patent No.: US 6,887,727 B2
(45) Date of Patent: May 3, 2005

(54) SYSTEM AND METHOD FOR INCREASING NITROGEN INCORPORATION INTO A SEMICONDUCTOR MATERIAL LAYER USING AN ADDITIONAL ELEMENT

(75) Inventors: Tetsuya Takeuchi, Sunnyvale, CA (US); Ying-Ian Chang, Cupertino, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/352,491

(22) Filed: Jan. 28, 2003

(65) Prior Publication Data

US 2004/0147052 A1 Jul. 29, 2004

(51) Int. Cl.[7] .............................................. H01L 21/20
(52) U.S. Cl. ........................... 438/22; 438/46; 438/483
(58) Field of Search ...................... 438/22–47, 479–509

(56) References Cited

U.S. PATENT DOCUMENTS 5,689,123 A * 11/1997 Major et al. ................. 257/190
5,945,689 A * 8/1999 Koike et al. .................. 257/88
6,207,973 B1    3/2001 Sato et al.

* cited by examiner

Primary Examiner—Savitri Mulpuri (57) ABSTRACT

A method and system for growing a layer of semiconductor material is disclosed. The method can be used to grow a layer of a semiconducting material comprising at least one Group III element, nitrogen and at least one other Group V element as constituent elements thereof, the method comprising providing a reactor and supplying precursors to the reactor. The precursors include a precursor for each of the at least one Group III element, a precursor for the nitrogen, a precursor for each of the at least one Group V element other than nitrogen, and a precursor for an element having a stronger bond strength with nitrogen than each of the at least one Group III element has with nitrogen. The method can be implemented in, for example, a metal organic chemical vapor deposition (MOCVD) reactor.

2 Claims, 4 Drawing Sheets

SYSTEM AND METHOD FOR INCREASING NITROGEN INCORPORATION INTO A SEMICONDUCTOR MATERIAL LAYER USING AN ADDITIONAL ELEMENT

FIELD OF THE INVENTION

The present invention generally relates to semiconductor devices and, more particularly, is related to semiconductor material layer fabrication.

BACKGROUND OF THE INVENTION

With advances in technology, there is a continuous demand to increase data transmission rates and volume of data transmission. Traditional communication lines, such as cable containing copper wire, have been used to cater to this continuously-growing demand. However, traditional communication lines are subject to many disadvantages. Traditional communication lines are susceptible to interference during the transmission of data. Examples of such interference include, but are not limited to, electromagnetic interference and inter-symbol interference. Traditional communication lines are also characterized by a limited bandwidth, thereby limiting the rate at which data are transmitted via traditional communication lines.

Fiber-optic telecommunication systems have been introduced to the telecommunication industry to overcome the shortcomings of traditional communication lines. Fiber-optic telecommunication systems are characterized by immunity to electromagnetic interference. Specifically, fiber-optic telecommunication uses optical fibers for the transmission of information. Since optical fibers transmit light, rather than electrons, optical fibers do not radiate electro-magnetic energy. In addition, fiber-optic telecommunication systems have high bandwidth for the transmission of information. As is known by those of ordinary skill in the art, high bandwidth permits higher signal transmission rates.

A basic fiber-optic network contains a transmitter, an optical fiber fiber-optic, and a receiver. The transmitter contains a light-emitting diode (LED), laser diode (LD), an edge-emitting laser, a vertical cavity surface-emitting laser (VCSEL), or any other device that converts an electrical signal into an optical signal for transmission via the optical fiber. The receiver typically contains a photodiode that converts the light received from the optical fiber back into an electrical signal, and an amplifier for amplifying the electrical signal to make detection of the electrical signal easier.

It is generally desirable for lasers that are used in fiber optic telecommunication systems to produce light at a single, relatively long wavelength, in the range from approximately 1.2–1.6 micrometers ($\mu$m). Light in the wavelength range from approximately 1.2–1.6 $\mu$m can be transmitted by an optical fiber over long distances with relatively little loss of signal intensity. However, light emission in the range of 1.2–1.6 $\mu$m requires the semiconductor laser to be fabricated from materials having corresponding bandgap energy. Photons in semiconductors are further discussed in B. Saleh et al., *Fundamentals of Photonics*, pp. 543–643 (1991), which is incorporated herein by reference.

A semiconductor laser capable of operating in the 1.2–1.6 $\mu$m wavelength region may be made using an active region of indium gallium arsenide phosphide (InGaAsP) grown on an InP wafer. However, InGaAsP has a small conduction band offset relative to InP, leading to performance degradation at high operating temperatures (i.e., greater than approximately eighty degrees Celsius). Therefore, semiconductor lasers incorporating InGaAsP require cooling systems, thereby increasing laser cost. In addition, it is difficult to grow high-quality distributed Bragg reflectors (DBRs) of a vertical cavity surface-emitting laser (VCSEL) on an InP wafer.

Indium gallium arsenide nitride (InGaAsN) is an attractive material for the active region of long wavelength edge-emitting lasers and VCSELs since InGaAsN can be grown on a gallium arsenide (GaAs) wafer. InGaAsN and GaAs have a high conduction band offset. Moreover, such devices can use GaAs/aluminum arsenide (AlAs) DBRs, which are more reflective than DBRs made of InP-compatible materials. However, using InGaAsN in a semiconductor laser gives rise to significant manufacturing challenges.

InGaAsN edge-emitting lasers and VCSELs capable of continuous wave operation can be grown by metal organic chemical vapor deposition (MOCVD), which is generally suitable for mass production. Dimethylhydrazine (($CH_3$)$_2NNH_2$, also denoted as DMHy) has been used as a nitrogen precursor in InGaAsN MOCVD growth. This nitrogen precursor, DMHy, has the advantages of a relatively low decomposition temperature and therefore is suitable for growing InGaAsN by metal organic chemical vapor deposition (MOCVD) at a typically low growth temperature (500–600 degrees Celsius). In addition, dimethylhydrazine is a liquid and has reasonably high vapor pressure at room temperature.

There are, however, disadvantages with using dimethylhydrazine as a nitrogen precursor. To obtain a laser capable of emission in the 1.3 $\mu$m range, for instance, InGaAsN having a composition of $In_{0.38}Ga_{0.62}As_{0.99}N_{0.01}$ is desired. However, due to extremely low N incorporation in InGaAsN using MOCVD with dimethylhydrazine as the N precursor, a dimethylhydrazine/total group-V precursor ratio of more than 95% is supplied to the MOCVD reactor to obtain an N/total group-V atoms ratio of 1% in solid composition. This results in a large consumption of dimethylhydrazine. In addition, the following InGaAsN quality issues result from use of dimethylhydrazine as a nitrogen precursor.

To enhance N incorporation in InGaAsN and to achieve a very high dimethylhydrazine/total group-V precursor ratio (e.g., more than 95%), a very low As/group III ratio (e.g., approximately 5) is required. However, a low As/group III ratio typically causes poor material quality in GaAs-based semiconductors. In an example characterized by a very high dimethylhydrazine/total group-V precursor ratio and a very low As/group III ratio, the ratio of the precursors for group III, As, and N is 1:5:100. With this ratio, the sticking coefficient of N is estimated to be approximately 0.0001.

Another negative aspect of using dimethylhydrazine as a nitrogen precursor is that the purity of dimethylhydrazine is currently not well-controlled, especially residual water level. Water contamination in dimethylhydrazine causes the grown material to have poor quality. As mentioned above, a laser operating with a wavelength of approximately 1.3 $\mu$m requires a large dimethylhydrazine/total group-V precursor ratio for InGaAsN growth. The large ratio requires a large amount of dimethylhydrazine to be supplied to the MOCVD reactor, resulting in opportunities for the incorporation of impurities into the InGaAsN.

In addition, InGaAsN having approximately 40% In is desired make an active region for a laser that is capable of light emission at 1.55 $\mu$m. In such a laser, approximately 3% N in the active region is also desirable. Unfortunately, such an In mole fraction tends to dramatically reduce N incorporation in InGaAsN. Therefore, it is difficult to make a laser incorporating InGaAsN for generating light at 1.55 μm. As a result, it is desirable to find a suitable way to enhance nitrogen incorporation in InGaAsN for semiconductor devices, such as semiconductor lasers and light emitting diodes (LEDs).

SUMMARY OF THE INVENTION

In light of the foregoing, the invention generally relates to a method and system for growing a layer of semiconductor material. In one embodiment, the invention is a method of growing a layer of a semiconductor material comprising at least one Group III element, nitrogen and at least one other Group V element as constituent elements thereof. The method comprises providing a reactor, and supplying precursors to the reactor, the precursors including a precursor for each of the at least one Group III element, a precursor for the nitrogen, a precursor for each of the at least one Group V element other than nitrogen, and a precursor for an element having a stronger bond strength with nitrogen than each of the at least one Group III element has with nitrogen.

Generally, with reference to the structure of the system, the system comprises a reactor, a precursor for each of the at least one Group III element, a precursor for the nitrogen, a precursor for each of the at least one Group V element other than nitrogen, and a precursor for an element having a stronger bond strength with nitrogen than each of the at least one Group III element has with nitrogen. The precursor for an element having a stronger bond strength with nitrogen than each of the at least one Group III element has with nitrogen improves the incorporation efficiency of nitrogen in the layer compared with when this precursor is absent, and reduces the amount of precursor used to supply the nitrogen. When dimethylhydrazine is used as the nitrogen precursor, the concentration of impurities incorporated into the semiconductor layer is reduced.

Further, the precursor for an element having a stronger bond strength with nitrogen than each of the at least one Group III element has with nitrogen increases the incorporation of nitrogen into the semiconductor layer, and, as a result, allows ammonia (NH3) to be used as the nitrogen precursor. Ammonia typically has a high purity, which improves the overall quality of the semiconductor material.

The use of the precursor for an element having a stronger bond strength with nitrogen than each of the at least one Group III element has with nitrogen allows an InGaAsN layer to be grown at a higher growth temperature and with a high As/group III ratio. These measures enable growth of high quality GaAs-based material.

Other systems and methods of the present invention will be or become apparent to one with skill in the art upon examination of the following drawings and detailed description. It is intended that all such additional systems, methods, features, and advantages be included within this description, be within the scope of the invention, and be protected by the accompanying claims.

BRIEF DESCRIPTION OF THE DRAWINGS

The invention can be better understood with reference to the following drawings. The components of the drawings are not necessarily to scale, emphasis instead being placed upon clearly illustrating the principles of the present invention. Moreover, in the drawings, like referenced numerals designate corresponding parts throughout the several views.

DETAILED DESCRIPTION

While the following description refers to growing a semiconductor laser having an active region including a layer of InGaAsN, it should be noted that the invention may be used to produce active regions having different compositions, and that may be used in other light emitting devices, such as a light emitting diode (LED).

The invention is a method and system for growing a layer of a Group III-V semiconductor material comprising at least one Group III element, nitrogen and at least one other Group V element. A precursor for an element having a stronger bond strength with nitrogen than each of the at least one Group III element has with nitrogen is introduced. Such an element can be, for example, boron (B), aluminum (Al), or silicon (Si). For example, aluminum atoms can be supplied by trimethylaluminum $((CH_3)_3Al)$ and triethylaluminum $((C_2H_5)_3Al)$; boron atoms can be supplied by trimethylboron $((CH_3)_3B)$, triethylboron $((C_2H_5)_3B)$, and diborane $(B_2H_6)$; and silicon can be supplied by disilane $(Si_2H_6)$ and monosilane $(SiH_4)$. The Al, B or Si atoms promote the incorporation of nitrogen into the InGaAsN semiconductor layer.

The semiconductor layer fabrication method and system uses Al, B or Si atoms, which have a stronger bonding strength to N atoms than In or Ga (Group III elements) atoms have to N atoms to grow an InGaAsN layer. The Al, B or Si atoms provided by the precursors promote the incorporation of N into the InGaAsN layer, thereby reducing the amount of dimethylhydrazine (the nitrogen precursor) used to produce the layer.

One of the factors that limit N incorporation is referred to as "desorption" of N from the surface. Desorption of N occurs as a result of the weaker bond strength between Ga atoms and N atoms, and between In atoms and N atoms, with a resultant formation of various molecules such as, for example, $NH_3$, $NH_2CH_3$, $NH(CH_3)_2$. By using atoms such as Al and B and Si to promote the incorporation of N into the InGaAsN layer, the number of N atoms incorporated into the layer is greater than the number of N atoms lost as a result of desorption.

If the N is bonded to other elements, such as Al, B or Si that have a stronger bond strength than Ga and In have with N, the loss of N from the surface through desorption is reduced. Further, the Al, B or Si atoms sufficiently promote the incorporation of N into the InGaAsN layer to allow the use of NH3 as the nitrogen precursor. The amount of Al, B or Si incorporated into the InGaAsN layer depends on the growth conditions and can vary from approximately 0% to ~5%.

One example of an indication of bond strength between atoms is atomization energy, which is energy required to break bonds between atoms. Table 1 illustrates bonds between an atom of B, Al, Ga and In and an atom of N. In addition, Table 1 illustrates the atomization energy required to break the respective bonds.

TABLE 1

| Bond | Atomization Energy |
| --- | --- |
| B—N | 300 |
| Al—N | 220 |
| Ga—N | 190 |
| In—N | 150 |

Table 1 illustrates that the bond between a B atom and a N atom, and the bond between an Al atom and a N atom have a higher atomization energy than the bond between a Ga atom and a N atom, or between an In atom and a N atom. Therefore, B and Al atoms have a stronger bond strength to N atoms than Ga or In atoms have to N atoms. In accordance with the invention, N incorporation in InGaAsN is improved if atoms such as B atoms, Al atoms or Si atoms are present on a growth surface for the InGaAsN. The B, Al or Si atoms act to promote the incorporation of N because of their respective high sticking coefficients.

The invention improves the incorporation efficiency of nitrogen into the InGaAsN layer. Conventional incorporation efficiency of N into an InGaAsN layer is on the order of ~0.0001 using dimethylhydrazine as a nitrogen precursor. By using an additional precursor containing Al, B or Si atoms, the incorporation efficiency of N into an InGaAsN layer is typically more than 0.1.

In accordance with a first exemplary embodiment of the invention, a precursor containing B atoms is used. B atoms have stronger bond strength to N atoms than In or Ga atoms have to N atoms, and B atoms have high incorporation efficiency into the InGaAsN layer of approximately 1.0. While the InGaAsN layer may contain trace amounts of B after growth using the precursor containing B atoms, the B concentration is small, and is typically on the order of the amount of N if all available N atoms form bonds with all available B atoms.

In an InGaAsN layer, the incorporation of B changes the bandgap in one direction. However, a small amount of N causes a large bowing effect and can easily compensate the change in the bandgap caused by the incorporation of B. For instance, 1% N incorporation can reduce the bandgap by approximately 160 meV, while 1% B or Al incorporation increases the bandgap by only about 10 meV. Accordingly, a small amount of B (or Al or Si) will likely have an insignificant impact on the physical and optical properties of the InGaAsN layer.

InGaAsN is an attractive material used in semiconductor lasers since it can be grown on GaAs wafers. InGaAsN has a higher conduction band offset relative to GaAs than between InGaAsP and InP. Moreover, a GaAs substrate enables highly reflective GaAs/AlAs distributed Bragg reflectors to be used. In addition, a semiconductor laser having InGaAsN in its active region can produce light having relatively long wavelength, in the range of approximately 1.2–1.6 $\mu$m. Light in this wavelength range is transmitted by an optical fiber over long distances with relatively little loss of light intensity. Further, use of a precursor containing B atoms to grow InGaAsN enables efficient mass production of edge-emitting lasers and surface-emitting lasers that use InGaAsN, as described below.

The InGaAsN layers fabricated using a precursor containing B atoms may be part not only of opto-electronic devices such as lasers and light-emitting diodes, but may also be part of electronic devices such as high electron mobility transistors and heterojunction bipolar transistors.

Examples of precursors containing B atoms include, but are not limited to, trimethylboron (($CH_3$)$_3$B, also denoted as TMB), diborane ($B_2H_6$), and triethylboron ($C_2H_5$)$_3$B, also denoted as TEB). In addition, when the additional B, Al or Si precursor is used, N incorporation into InGaAsN layers using precursors containing B, Al or Si atoms has little dependence on the As/group III ratio. Therefore, by using one of these precursors, InGaAsN can be grown at a higher growth temperature and with a higher As/group III ratio than without one of these additional precursors. The higher growth temperature and higher As/III ratio typically yield higher quality GaAs-based materials including InGaAsN. In addition, a lower concentration of impurities will be incorporated into InGaAsN layers due to the reduced DMHy supply or by using ammonia (NH3), which typically has better purity than DMHy, as the N precursor.

Figure 1:
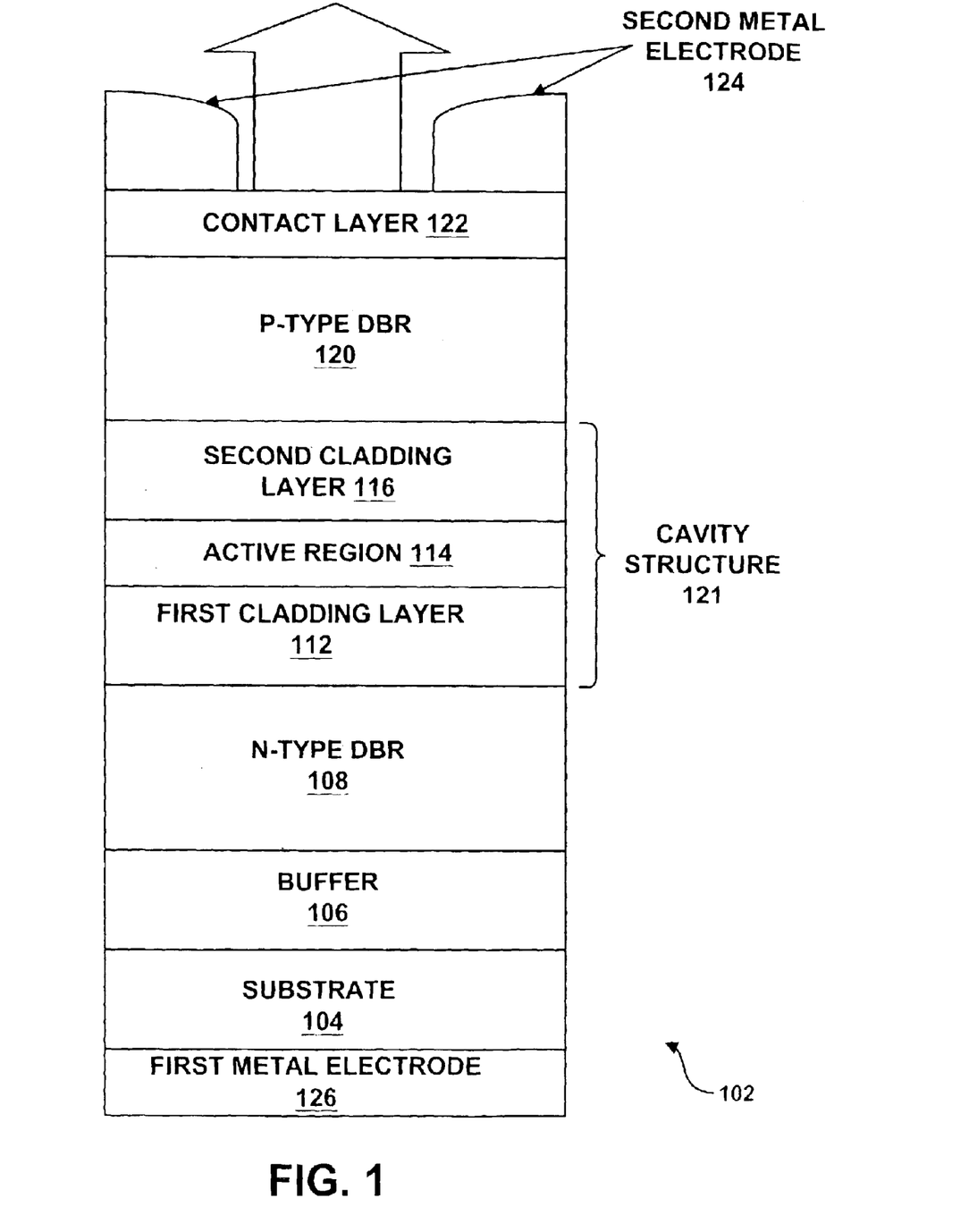
FIG. 1 is a schematic diagram illustrating an example of a VCSEL, a portion of which contains an InGaAsN layer.

The strong bond strength between B atoms and N atoms results in successful growth of InGaAsN with approximately forty percent (40%) In and three percent (3%) N. This material enables lasers that emit light at 1.55 $\mu$m to be made. Further discussion of the above precursors is provided below. It should be noted that while the following describes the growth of InGaAsN as part of a semiconductor laser, the process described might be used to grow InGaAsN in the fabrication of other devices Vertical Cavity Surface-Emitting Laser The following describes a vertical cavity surface-emitting laser (VCSEL) that incorporates a layer of InGaAsN grown using the method and system according to the invention, wherein a precursor containing B atoms is used to form the InGaAsN layer used in the active region of the VCSEL. FIG. 1 is a schematic diagram illustrating a VCSEL 102, the active layer of which contains InGaAsN fabricated via use of the present method and system. The strong bonds between B and N result in improved N incorporation in InGaAsN. As an example, the bonds between B and N provide successful growth of InGaAsN having forty percent (40%) In and three percent (3%) N. This material is suitable for use in the active layer of a laser that generates light at a wavelength of approximately 1.55 $\mu$m.

The VCSEL 102 contains several layers, each of which is discussed in detail below. Specifically, the VCSEL 102 contains a GaAs substrate 104, on the bottom of which is located a first metal electrode 126. A buffer layer 106, composed of GaAs, is located on the GaAs substrate 104. An n-type DBR 108 is located on the buffer layer 106.

Figure 3:
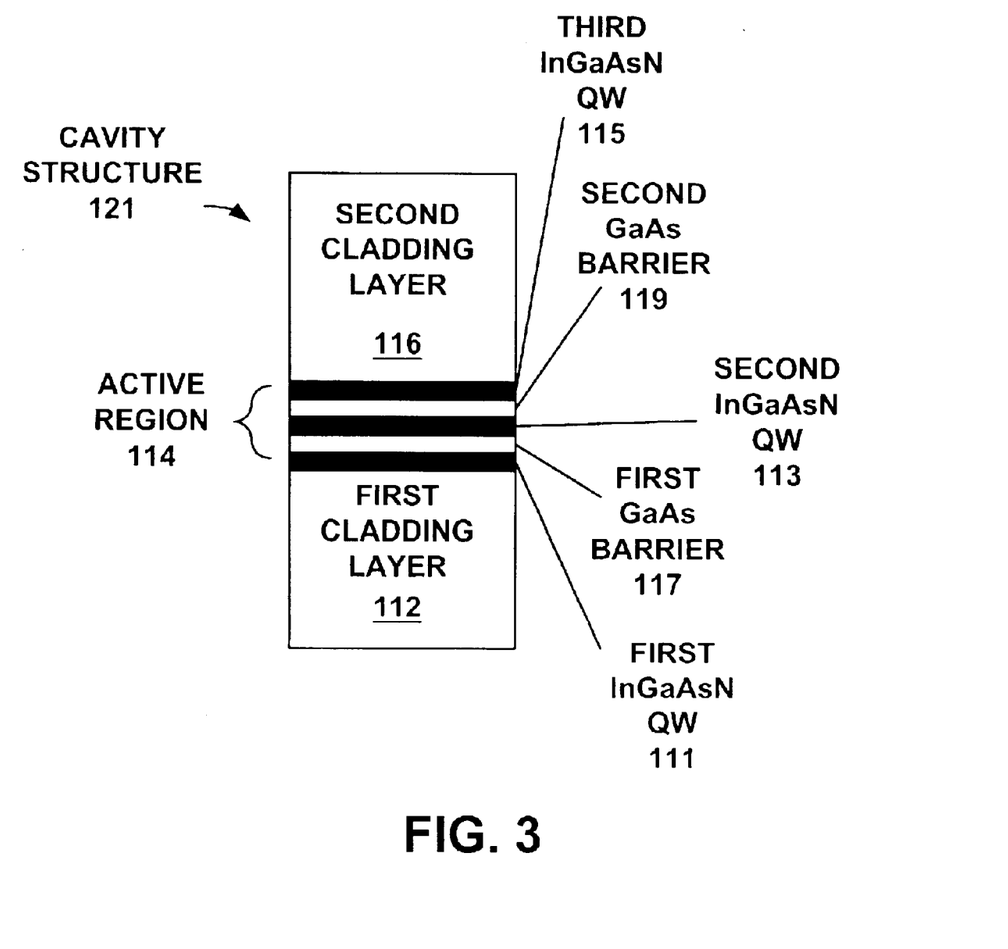
FIG. 3 is a schematic diagram further illustrating the cavity structure located within the VCSEL of FIG. 1.

A cavity structure 121 is located on the n-type DBR 108. The cavity structure 121 contains a first cladding layer 112 located on the n-type DBR 108 and an active region 114 located between the first cladding layer 112 and a second cladding layer 116. FIG. 3 is a schematic diagram further illustrating the cavity structure 121.

A p-type DBR 120 is located on the second cladding layer 116. A contact layer 122 made of GaAs is located on the p-type DBR 120. A second metal electrode 124 is located on the exposed surface of the contact layer 122. The materials of the layers constituting the VCSEL 102, as well as the thickness of the layers, are described below with reference to FIG. 2, which illustrates a method by which the VCSEL 102 of is fabricated. It should be noted that materials other than those disclosed herein might be used in some of the layers of the VCSEL 102. The VCSEL 102 is fabricated using metal organic chemical vapor deposition (MOCVD). As is known in the art, MOCVD uses liquid chemical precursors through which an inert carrier gas is passed to generate a chemical vapor. The chemical vapor is passed over a heated semiconductor substrate located in a growth chamber, which is referred to as an MOCVD reactor. Conditions in the MOCVD reactor are controlled so that the gaseous precursors form an epitaxial film as they pass over the substrate. Use of an MOCVD reactor for growing the VCSEL 102 is described for exemplary purposes.

Figure 2:
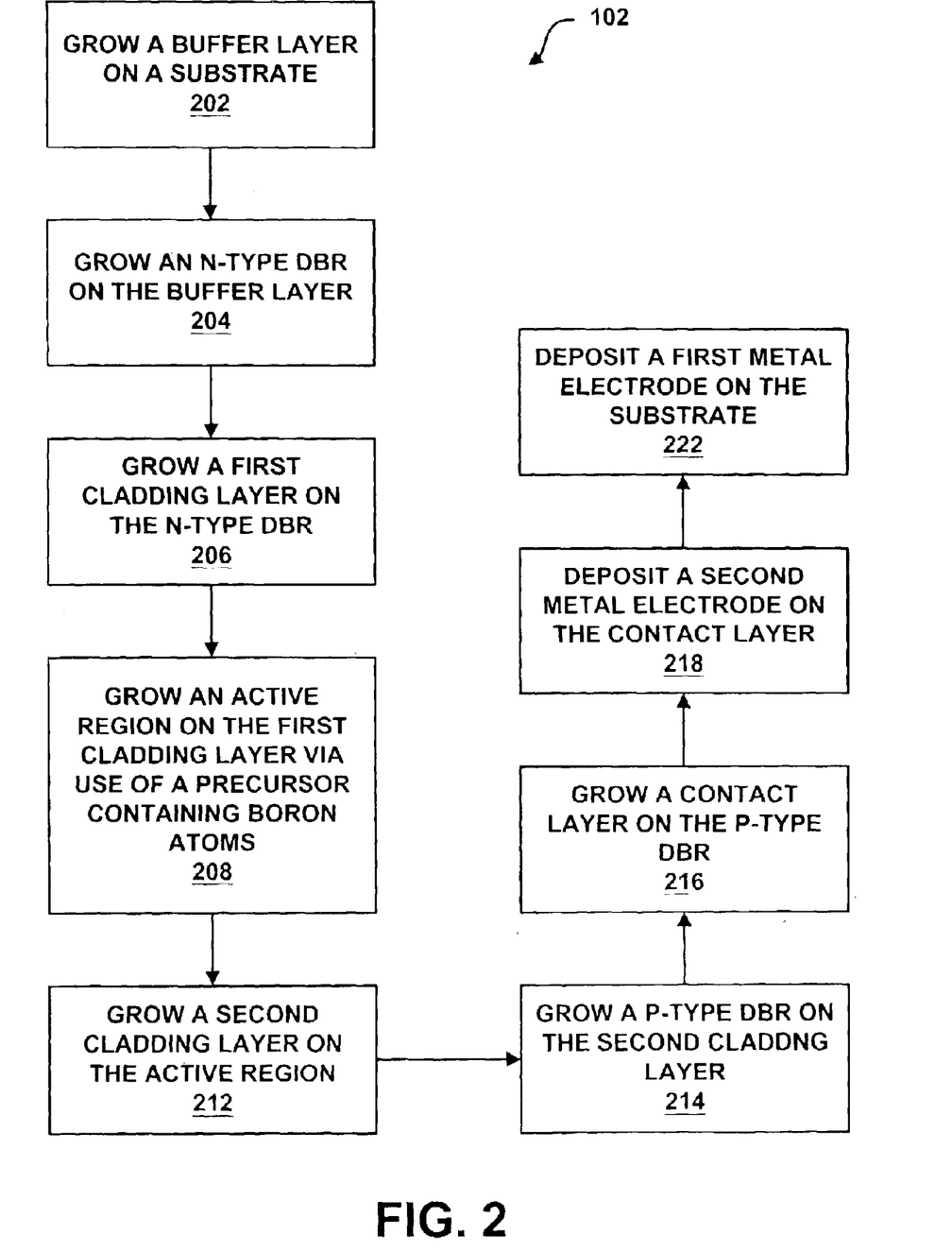
FIG. 2 is a flowchart illustrating the process of fabricating the VCSEL of FIG. 1.

FIG. 2 is a flowchart that shows an exemplary method according to the invention of fabricating a VCSEL, the active region of which contains an InGaAsN layer grown using a precursor containing B atoms.

Each block of the flowcharts represents a portion of a method. In some alternative implementations, the processes described in the blocks may be performed out of the order shown in the flowcharts. For example, two blocks shown in succession may in fact be performed substantially concurrently or the blocks may sometimes be performed in the reverse order.

While the following describes a method by which a single VCSEL 102 is fabricated, the fabrication process is typically used to fabricate a VCSEL layer structure from which multiple VCSELs, such as the VCSEL 102, may be made.

As shown in FIG. 1, VCSEL 102 is grown on the n-type GaAs substrate 104. The GaAs substrate 104 is an n-type GaAs substrate. The GaAs substrate 104 may be prepared for fabrication as follows. The GaAs substrate 104 is transferred to a MOCVD reactor (described below with reference to FIG. 4). Reactor pressure is then decreased to approximately 50 millibar (mbar), and the atmosphere inside the MOCVD reactor is thoroughly replaced with nitrogen to remove oxygen and moisture. Hydrogen and arsine are introduced to the MOCVD reactor at a pressure in the range of 50–1000 mbar, after which the GaAs substrate is heated to 600–800 degrees Celsius (° C.) for approximately five minutes to clean the GaAs substrate. This results in the GaAs substrate 104.

In block 202, the buffer layer 106 is grown on the GaAs substrate 104. The buffer layer 106 is made of Si-doped ($5 \times 10^{17}$–$5 \times 10^{18}$ cm$^{-3}$) n-type GaAs 100–500 nanometers (nm) thick grown at a temperature between 600 and 800 degrees ° C. using triethygallium ($(C_2H_5)_3Ga$, also denoted as TEGa) and tertiarybutylarsine ($(C_4H_9)H_2As$, also denoted as TBAs) as the gallium and arsenic precursors, respectively. The GaAs buffer layer 106 may also have a thickness different from the thickness mentioned above. The GaAs buffer layer 106 compensates for surface imperfections of the GaAs substrate 104 such as, but not limited to, impurities at the surface of the GaAs substrate 104 and/or a non-flat surface.

In block 204, the n-type DBR 108 is grown on the GaAs buffer layer 106 at a temperature between 600 and 800° C. In accordance with this exemplary embodiment of the invention, the n-type DBR 108 contains 35–45 layer pairs, each composed of a Si-doped ($5 \times 10^{17}$–$5 \times 10^{18}$ cm$^{-3}$) $Al_xGa_{1-x}As$ ($0.8 < x \leq 1$) layer and a Si-doped ($5 \times 10^{17}$–$5 \times 10^{18}$ cm$^{-3}$) GaAs layer. The $Al_xGa_{1-x}As$ layers are grown to a thickness corresponding to one quarter of the emission wavelength of the VCSEL 102 in the material of the layer. The GaAs layers are also grown to a thickness corresponding to one quarter of the emission wavelength of the VCSEL 102 in the material of the layer with approximately 10–30 nm of linear grading at each interface between the $Al_xGa_{1-x}As$ layer and the GaAs layer. The reflectivity of a DBR is determined by the index of refraction difference between the materials of the layer pairs of the DBR and the number of layer pairs constituting the DBR. These parameters, as well as others, can be varied to fabricate a DBR having specific reflective properties.

The first cladding layer 112 is grown on the n-type DBR 108 in block 206. In accordance with this exemplary embodiment of the invention, the first cladding layer 112 is made of GaAs, and is 150–170 nm thick. In addition, the first cladding layer 112 is grown at approximately 500–600° C. The first cladding layer 112 may alternatively be fabricated using different materials, such as AlGaAs, InGaAsP, GaAsP, AlInGaAsN, or GaAsN. The material of the first cladding layer 112 depends upon the desired properties of the VCSEL 102, such as, for example, larger valence band offset and/or strain compensation for the active region (described below). No dopant is added to the materials of the first cladding layer 112, the active region 114, and the second cladding layer 116 during growth of these layers.

In block 208, the active region 114 is grown on the first cladding layer 112. Fabrication of the active region 114 may be performed in a variety of ways. FIG. 3 is a schematic diagram further illustrating the cavity structure 121 of FIG. 1. The active region 114 is composed of three InGaAsN quantum well layers 6–10 nm thick, namely a first InGaAsN quantum well layer 111, a second InGaAsN quantum well layer 113, and a third InGaAsN quantum well layer 115 interleaved with two GaAs barrier layers 5–30 nm thick, namely 117 and 119. Each of the quantum well layers is grown at approximately 500–600° C. using triethygallium ($(C_2H_5)_3Ga$, also denoted as TEGa) as the gallium precursor, trimethylindium ($(CH_3)_3In$, also denoted as TMIn) as the indium precursor, tertiarybutylarsine ($(C_4H_9)H_2As$, also denoted as TBAs) as the arsenic precursor, dimethylhydrazine ($(CH_3)_2NNH_2$, also denoted as DMHy) as the nitrogen precursor and a precursor containing B atoms. Suitable precursors containing boron atoms include trimethylboron ($(CH_3)_3B$), triethylboron ($(C_2H_5)_3B$), and diborane ($B_2H_6$). In alternative embodiments, precursors containing Al atoms, such as trimethylaluminum ($(CH_3)_3Al$) and triethylaluminum ($(C_2H_5)_3Al$), or precursors containing Si atoms, such as disilane ($Si_2H_6$) and monosilane ($SiH_4$) may be used.

The first barrier layer 117 is grown on the first InGaAsN quantum well layer 111 and the second barrier layer 119 is grown on the second InGaAsN quantum well layer 113 by interrupting the supplies of the indium and nitrogen precursors to the reactor. Instead of being made of GaAs, the barrier layers 117, 119 may be made of GaAsN, GaAsP, InGaP, InGaAs, InGaAsP, or InGaAsN to obtain desired VCSEL 102 properties, such as larger carrier confinement and/or appropriate strain for InGaAsN quantum well layers 111, 113, 115.

It should be noted that the first cladding layer 112 additionally functions as a barrier layer for the first InGaAsN quantum well layer 111 and the second cladding layer 116 additionally functions as a barrier layer for the third InGaAsN quantum well layer 115. Therefore, each InGaAsN quantum well layer 111, 113, 115 is sandwiched between two layers of GaAs.

Figure 4:
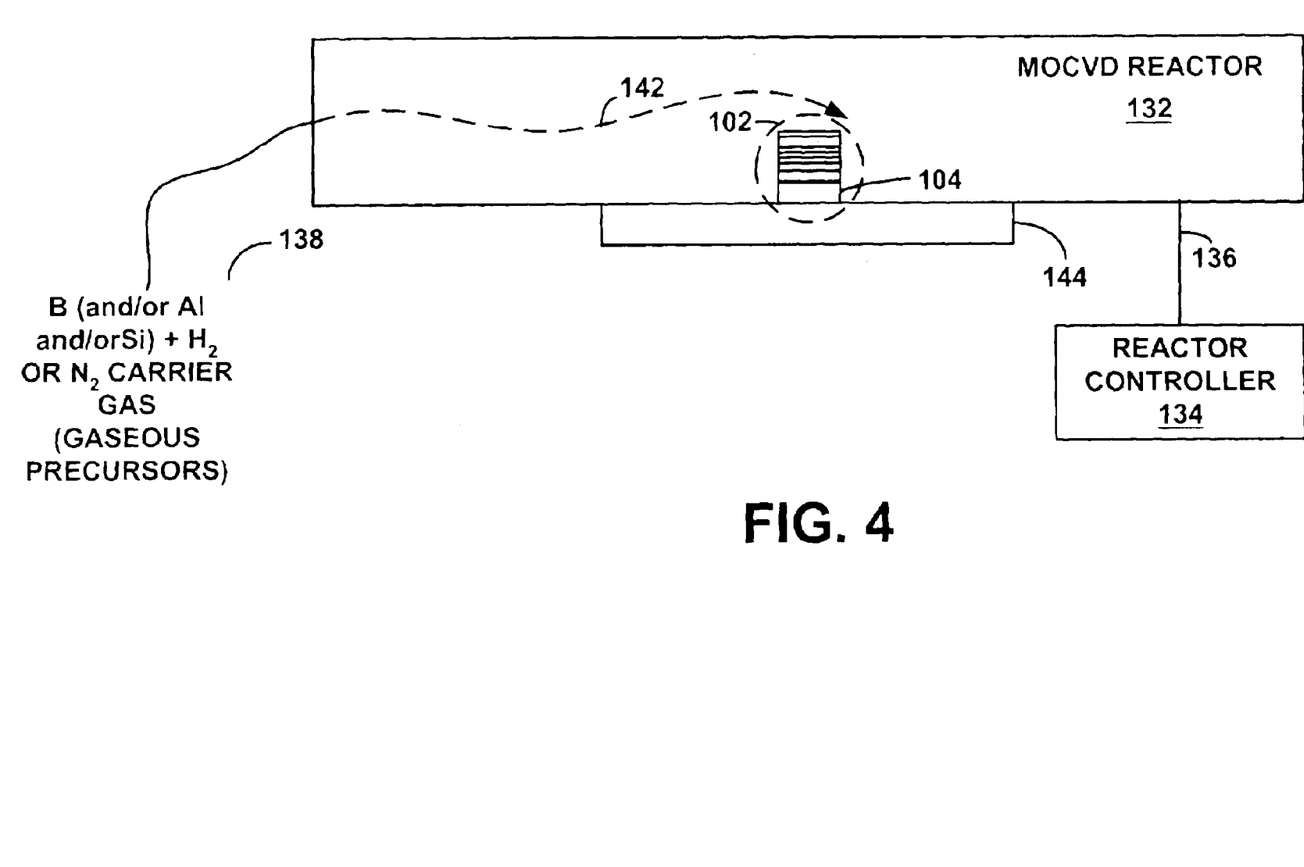
FIG. 4 is a schematic diagram illustrating an MOCVD reactor used to grow the active region of the VCSEL of FIG. 1.

The active region 114 may alternatively contain a single InGaAsN quantum well layer 6–10 nm thick. Growth of the 6–10 nm InGaAsN quantum well layer may be performed by supplying TMIn, DMHy, and the precursor containing B atoms to an MOCVD reactor 132 (FIG. 4) (described below), in addition to TEGa and TBAs. If a multiple quantum well layer structure is desired, as in the active region 114 shown in FIG. 3, each GaAs barrier layer 117, 119 is grown on a respective InGaAsN quantum well layer 111, 113, 115 by discontinuing the flow of TMIn, DMHy, and the precursor containing B atoms from the MOCVD reactor 132 (FIG. 4). It should be noted that the growth of InGaAsN quantum well layers 111, 113, 115 may be repeated as many times as desired.

The use of InGaAsN as the material of the quantum well layers 111, 113, 115 in the active region 114 provides the desired electron and hole confinement in the active region 114. If, instead, the prior art InGaAsP/InP material system were used the lower conduction band offset would mean that electrons would not be well confined within the active region 114, resulting in increased carrier overflow from the active region. Heat generated in the VCSEL incorporating the conventional InP/InGaAsP active region would decrease performance due to an increase in threshold current density. As a result, VCSELs having an active region including InGaAsP may need a cooling system. As stated above, this is undesirable.

Referring again to FIG. 1 and FIG. 2, in block 212 the second cladding layer 116 of GaAs is grown on the active region 114. The second cladding layer 116 is 150–170 nm thick and is grown at a temperature of approximately 600–800° C. The second cladding layer 116 may alternatively be fabricated using different materials, such as AlGaAs, InGaAsP, GaAsP, AlInGaAsN, or GaAsN. For example, the material of the layer depends upon the desired properties of the VCSEL 102, such as larger conduction band offset relative to the active region 114, and/or to establish a desired strain profile in the active region.

The first and second cladding layers 112, 116 and the active region 114 constitute the cavity structure 121. The thickness of the cavity structure 121 preferably corresponds to n times the wavelength of light to be emitted by the VCSEL 102 in the materials of the cavity structure 121, where n is an integer. As an example, in an embodiment in which n equals 1 and the desired wavelength of emitted light is 1.3 $\mu$m, the thickness of the cavity structure 121 is approximately 380 nm, which is 1.3 $\mu$m divided by the refractive index of GaAs, which is 3.4. n is typically between 1 and 3, but may be outside this range.

In block 214, the p-type DBR 120 is grown on the second cladding layer 116. The p-type DBR 120 contains 20–35 layer pairs, each composed of a C-doped ($5 \times 10^{17}$–$5 \times 10^{18}$ cm$^{-3}$) $Al_xGa_{1-x}As$ ($0.8 < x \leq 1$) layer and a C-doped ($5 \times 10^{17}$–$5 \times 10^{18}$ cm$^{-3}$) $Al_yGa_{1-y}As$ ($0 \leq y < 0.2$) layer. The $Al_xGa_{1-x}As$ layers are grown to a thickness corresponding to one quarter of the emission wavelength of the VCSEL 102 in the material of the layer. The $Al_yGa_{1-y}As$ layers are also grown to a thickness corresponding to one quarter of the emission wavelength of the VCSEL 102 in the material of the layer, with approximately 10–30 nm of linear grading at each interface between the $Al_xGa_{1-x}As$ and the $Al_yGa_{1-y}As$.

The p-type DBR 120 may additionally include a layer of C-doped $Al_zGa_{1-z}As$ 10–30 nm thick that will be used to make a laterally oxidized layer for the purpose of providing current confinement. The value of z in the $Al_zGa_{1-z}As$ layer is selected to be higher than the value of x selected for other $Al_xGa_{1-x}As$ layers in the VCSEL 102 since the rate of oxidation is strongly dependent on the Al content of AlGaAs layers. U.S. Pat. No. 5,896,408 provides an example of oxidized layer structures and is incorporated by reference in its entirety. It should also be noted that ion implantation may also be used to provide current confinement either alone or in conjunction with a laterally oxidized layer.

In block 216, the p-contact layer 122 is grown over the p-type DBR 120. The contact layer 122 is heavily C-doped ($5 \times 10^{18}$–$1 \times 10^{20}$ cm$^{-3}$) GaAs 50–100 nm thick. The contact layer 122 provides a low resistance contact with the second metal electrode 124, which is deposited thereon. The second metal electrode 124 is deposited on the p-contact layer 122 in block 218 to provide an electrical connection thereto. The VCSEL 102 also contains the first metal electrode 126, which is deposited on the GaAs substrate 104 in block 222 using a metal deposition process to provide an electrical connection to the GaAs substrate 104.

An example of an MOCVD reactor 132 that can be used to grow the VCSEL 102 will be described with reference to FIG. 4, and with additional reference to FIG. 1. Many of the details of the MOCVD reactor 132 are known by those skilled in the art and will be omitted for clarity. A reactor controller 134 is coupled to the MOCVD reactor 132 via connection 136. The reactor controller 134 controls various operating aspects and parameters of the MOCVD reactor 132. As will be described below, the reactor controller 134 is used to control, among other parameters, the amount of precursor introduced to the MOCVD reactor 132 during epitaxial growth.

To facilitate MOCVD epitaxial growth, an inert carrier gas is bubbled through the constituent precursor compounds so that a saturated gaseous precursor is created for each element. The saturated gaseous precursors are diluted with other gases and are transported into the MOCVD reactor 132 by the carrier gas. The saturated gaseous precursors pass over a heated substrate wafer (e.g., the GaAs substrate 104), yielding constituent atomic elements. Arrow 142 illustrates the saturated gaseous precursors passing over the heated substrate wafer. The atomic elements are deposited on the heated substrate wafer, where they bond to the underlying crystal structure of the substrate wafer to form an epitaxial layer.

In the example shown in FIG. 4, and to facilitate the growth of an InGaAsN quantum well layer, the precursors 138 include a precursor containing B atoms, in addition to the precursors TMIn, TEGa, TBAs, and DMHy, for yielding indium, gallium, arsenic and nitrogen, respectively. Other gaseous precursors can also be used depending on the desired composition of the epitaxial layers. The inert carrier gas can be, for example, hydrogen ($H_2$) or nitrogen ($N_2$). The inert carrier gas is bubbled through the precursors to create the saturated gaseous precursors. The resultant saturated gaseous precursors and inert carrier gases are subsequently combined into a gaseous mixture of the appropriate concentrations, and the mixture passes into the MOCVD reactor 132.

To achieve optimum layer thickness, composition uniformity and interface abruptness, additional carrier gas may be introduced to increase mixture flow velocity. A heated susceptor 144 includes a heated surface that is typically made of graphite, silicon carbide, or molybdenum, on which the GaAs substrate 104 resides. The n-type GaAs buffer layer 106, n-type DBR 108, first cladding layer 1112, active region 114, second cladding layer 116, p-type DBR 120, and contact layer 122 are grown over the GaAs substrate 104 to form the VCSEL 102.

In accordance with an alternative embodiment of the invention, a precursor containing Al atoms is used. Al atoms have stronger bond strength to N atoms than In or Ga atoms have to nitrogen atoms, and Al atoms have high incorporation efficiency into the InGaAsN layer of approximately 1.0. The precursors containing Al atoms are also effective to enhance N incorporation within grown semiconductor materials in the same manner as that provided by the precursors containing B atoms. Examples of precursors having Al atoms include, but are not limited to, trimethylaluminum (($CH_3$)$_3$Al, also denoted as TMAl) and triethylaluminum (($C_2H_5$)$_3$Al, also denoted as TEAl).

In accordance with a second alternative embodiment of the invention, a precursor containing Si atoms is used. Si atoms have a stronger attractive force to N atoms than In or Ga atoms have to N atoms and Si atoms also have high incorporation efficiency into the InGaAsN layer of approximately 0.5. The precursors containing Si atoms are also effective to enhance N incorporation within grown semiconductor materials in the same manner as that provided by the precursors containing B atoms and Al atoms. Examples of precursors having Si atoms include, but are not limited to, disilane ($Si_2H_6$) and monosilane ($SiH_4$).

In accordance with a third alternative embodiment of the invention, precursors containing Al, B, and Si atoms are used. The precursors containing Al, B, and Si atoms are also effective to enhance N incorporation within semiconductor lasers in the same manner as that provided by the precursors containing B atoms exclusively. An example of a precursor having Al, B, and Si atoms includes, but is not limited to, a precursor having a combination of $(CH_3)_3Al$, $(CH_3)_3B$, and $Si_2H_6$.

It should be emphasized that the above-described embodiments of the present invention are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

We claim:

1. A method of growing a layer of a semiconductor material comprising at least one Group III element, nitrogen and at least one other Group V element as constituent elements thereof, the method comprising:

providing a reactor; and supplying precursors to the reactor, the precursors including:

a precursor for each of the at least one Group III element, a precursor for the nitrogen, a precursor for each of the at least one Group V element other than nitrogen, and a precursor for an element having a stronger bond strength with nitrogen than each of the at least one Group III element has with nitrogen, the precursor for an element having a stronger bond strength with nitrogen than each of the at least one Group III element has with nitrogen being chosen from the group consisting of a precursor having boron atoms and a precursor having silicon atoms.

2. The method of claim 1, wherein the reactor is a metal organic chemical vapor deposition reactor.

* * * * *